United States Patent [19]

Avison et al.

[11] Patent Number: 4,678,995

[45] Date of Patent: Jul. 7, 1987

[54] APPARATUS AND METHOD FOR DETERMINING THE PRESENCE OF SUBSTANCES IN A SAMPLE BY NMR AND PRODUCING AN NMR IMAGE THEREOF

[75] Inventors: Malcolm J. Avison; Hoby P. Hetherington, both of New Haven; Thomas H. Jue, Branford; Douglas L. Rothman, New Haven, all of Conn.

[73] Assignee: Yale University, New Haven, Conn.

[21] Appl. No.: 680,866

[22] Filed: Dec. 12, 1984

[51] Int. Cl.⁴ .............................................. G01R 33/20
[52] U.S. Cl. .................................... 324/309; 324/312; 324/314
[58] Field of Search ............... 324/307, 309, 311, 312, 324/314; 128/653

[56] References Cited

U.S. PATENT DOCUMENTS 4,484,138  11/1984  Bottomley et al. ................. 324/307
4,532,474  7/1985   Edelstein ............................ 324/309
4,567,440  1/1986   Haselgrove ......................... 324/309

OTHER PUBLICATIONS

Image Formation by Induced Local Interactions: Examples Employing Nuclear Magnetic Resonance, P. C. Lauterbur, Mar. 16, 1973, 190–191.
Image Formation by Nuclear Magnetic Resonance: The Sensitive-Point Method, Waldo S. Hinshaw, Jun. 17, 1975; 3709–3721.
Field Focusing Nuclear Magnetic Resonance (FONAR): Visualization of a Tumor in a Live Animal; Raymond Damadian, et al.

Primary Examiner—Stewart J. Levy
Assistant Examiner—Kevin D. O'Shea
Attorney, Agent, or Firm—Cushman, Darby & Cushman

[57] ABSTRACT

An apparatus and method of unambiguously determining the presence of specific substances in a sample by NMR and then obtaining a high resolution NMR image of these substances. The sample is placed in a static magnetic field and repetitively subjected to first and second frequency selective RF pulse sequences to excite nuclear spins in the sample and to produce spin echo signals. The first and second pulse sequences are so constructed that signals from the substances are received while signals from the water component of the sample are suppressed. A third frequency selective pulse sequence is applied to the sample during every second repetition of the first and second pulse sequences to edit the acquired NMR spectra. By differencing the NMR signals received in the presence and the absence of the third pulse sequence, the signals of the substance of interest are unambiguously determined. In order to produce an NMR image of the substances, pulsed magnetic field gradients are applied to the sample during a period when no RF pulse sequences are being applied. This phase or frequency encodes spatial distribution information about the substance in the sample. The resultant NMR signal is then Fourier transformed to produce the desired image.

56 Claims, 6 Drawing Figures

LEGEND $F_1$ = TRANSMITTER FREQUENCY
$\phi_1$ = TRANSMITTER PHASE
$F$ = DECOUPLER FREQUENCY
$\phi$ = DECOUPLER PHASE
$\phi_3$ = RECEIVER PHASE
GAIN = RECEIVER GAIN

APPARATUS AND METHOD FOR DETERMINING THE PRESENCE OF SUBSTANCES IN A SAMPLE BY NMR AND PRODUCING AN NMR IMAGE THEREOF

This invention was made with Government support under Grant No. PCM8402670 awarded by the National Science Foundation and Grant No. AM27121 awarded by the National Institute of Health. The Government has certain rights in this invention.

BACKGROUND OF THE INVENTION

This invention relates to NMR imaging apparatus and methods. More specifically, this invention relates to apparatus and methods of obtaining spatially resolved, high resolution spectra of low concentration substances in tissue containing a large solvent peak.

Nuclear Magnetic Resonance (NMR) is a very useful tool in medical diagnosis and chemical experimentation. A sample to be analyzed is placed in a static homogeneous magnetic field. The sample contains nuclei which are spinning at a given rate which produces an angular magnetic moment for each nucleus. The static magnetic field has the effect of aligning the spin-axis of each nucleus with or against the magnetic field. The sample is then bombarded with RF energy which excites the nuclei causing them to "flip" to higher energy states. As the nuclei flip, they absorb RF energy which is then given off as the nuclei relax. This energy emission (the free induction decay) is observed using an RF receiver. Each set of nuclei will emit energy at a characteristic frequency, known as resonance. Therefore, by analyzing the frequency spectrum of the observed signal, the presence of a particular set of nuclei in the sample can be determined. The resonant frequency may be shifted by changing the chemical environment in which the nuclei are located. This is known as a chemical shift and is important in distinguishing like nuclei located in different chemical compounds. Problems exist in that many samples contain nuclei with overlapping or near identical resonant frequencies. Also, a wide variety of resonances may be present in the sample while the experimentor wishes only to observe one of the resonances. These problems may be compounded when an attempt is made to take the observed frequency spectrum and create a two or three-dimensional image of the chemical in the sample.

Many methods exist for analyzing and mapping a specimen using NMR techniques. For example U.S. Pat. No. 4,431,968 to Edelstein et al describes a method of three-dimensional imaging in a thick-slab sample by using frequency selective RF pulses to excite the sample and then applying pulsed gradient magnetic fields to phase encode spatial information about the sample. The resultant NMR signal, after Fourier analysis, provides a three-dimensional image of the sample including nuclear spin density and relaxation time information.

The "filtered back-projection reconstruction" method described by P.C. Lauterbur in "Image Formation by Induced Local Interactions: Examples Employing NMR", Nature, 242, pp. 190–191 (1973), utilizes a series of image projections taken at many angles around a plane passing through the object. Each projection contains some unique information about the object and, by suitable mathematical manipulation, the information can be used to form an image of the object.

The "sensitive point" method described by W.S. Hinshaw in "Image Formation by Nuclear Magnetic Resonance: The Sensitive-Point Method", Journal of Applied Physics, Vol. 47, p. 3709 (1976), applies alternate magnetic field gradients along all three orthogonal axes of the sample. Thus, there exists a point in the sample where no magnetic field fluctuations exist and the conditions for resonance are satisfied. This point is then scanned through the sample in raster fashion and the returning signals are recorded.

The "field focusing NMR (FONAR)" method described by R. Damadian, L. Minkoff, M. Goldsmith and J. D. Koutcher in "Field Focusing Nuclear Magnetic Resonance (FONAR): Visualization of a Tumor in a Live Animal", Science, Vol. 194, pp. 1430–1432 (1976), utilizes a saddle-shaped magnetic field to provide a resonant sensitive area in the sample. Following a frequency selective RF excitation, appreciable signal is obtained only from the region of the saddle point. Again, the sensitive point can be electro-magnetically scanned through the sample.

The "depth pulse" method described by M. R. Bendall in "Depth and Refocusing Pulses Designed for Multipulse NMR with Surface Coils", Journal of Magnetic Resonance, 53, pp. 365–385 (1983), utilizes a surface coil to obtain spatial discrimination. When a surface coil is used, the RF excitation pulse angle decreases rapidly as it penetrates the sample. The length of the RF pulse and hence the pulse angle can be varied and the signal intensity obtained from any sample region will be related to the pulse angle. Consequently, the location of maximum signal intensity will indicate a specific location in the sample. The RF pulses can be varied and location information can be obtained from throughout the sample.

The "4-D Fourier spectroscopic imaging" method as described by A.A. Maudsley, S.K. Hilal, W. H. Perman, and H.E. Simon in "Spatially Resolved High Resolution Spectroscopy by 'Four-Dimensional' NMR", Journal of Magnetic Resonance, 51, pp. 147–152 (1983) produces a full set of information from all parts of the sample in a single experiment. First a broad frequency-band pulse is applied to a sample and the free induction decay is allowed to evolve in the presence of a magnetic field gradient, the amplitude of which is varied along the x, y and z axes. Next a 180° pulse is applied and the spin echo is observed. During the second echo evolution period, no field gradients are applied and the spins evolve only under the local interactions, providing a high resolution spectrum after Fourier transformation of the detected signal. The amplitudes of the field gradients are varied and a complete four dimensional time data set is obtained. A four-dimensional Fourier transformation results in an NMR spectrum indicating the presence of nuclear spins at each spatial location.

The methods described above do not appear to be capable of yielding a high resolution $^1H$ NMR image of substances, particularly metabolites such as lactate, which exist in low concentrations in tissue samples having a high water and lipid concentration. This is so because each of these methods either does not adequately suppress the water and lipid signals, or does not adequately edit the received signal so as to unambiguously locate the substance in the sample, or does not image the entire sample volume but only "looks at" slices or thick slabs of the sample.

When a sample containing a substance of interest, such as lactate, is subjected to the NMR imaging methods described above, the lactate proton resonances are often not detectable in the presence of the large water resonance. This is a consequence of the dynamic range problem associated with the very high concentrations of tissue water and lipid as compared to the low concentration of lactate. Thus, it is difficult to determine unambiguously the presence and location of the lactate in the sample. When the water is suppressed, the presence of the metabolite must be unambigiously determined by editing the spectra to eliminate signals emanating from lipid and other metabolites not of interest. Therefore, known imaging methods require great sensitivity in the measuring equipment and a great amount of computation in order to perform the chemical shift transform required to obtain satisfactory imaging information from the sample.

SUMMARY OF THE INVENTION

The NMR imaging apparatus and method of the present invention are designed to overcome the drawbacks of existing methods as described above. The apparatus and method according to the present invention yields a high resolution NMR image of a low concentration substance, for example a metabolite, in a sample. It does this by selectively exciting the nuclei of interest with a first RF pulse or pulse sequence to produce a signal in a particular region of the spectrum; applying a second selective RF pulse or pulse sequence to produce a spin echo, applying a third selective RF pulse or pulse sequence to selectively invert a region of the spectrum, and differencing the signals obtained with and without application of the third frequency selective RF pulse to isolate information about essentially one region of the spectrum. An imaging technique is then performed, for example by phase encoding spatial distribution information about the metabolite in the NMR signal, and using Fourier transformation to produce a high resolution NMR image of the metabolite in the sample.

To suppress the water signals while receiving the NMR signals of the metabolite of interest, the sample is placed in a static magnetic field and subjected to a selective RF pulse sequence.

The selective pulses are applied so as to selectively excite the nuclei of interest to produce a signal in a region of the NMR spectrum in which the substance has a characteristic resonance, and consist of at least one first selective pulse or pulse sequence, and at least one second selective pulse or pulse sequence adapted to produce a spin echo, to refocus spins perturbed by the first selective pulse. In order to produce the spin echo, the intensity of the second selective pulse or pulse sequence will optimally be twice that of the said at least one first selective pulse. Theoretically, each of the first and second selective pulses may be a single pulse of Gaussian form, which may be considered for practical purposes as a single pulse with a very narrow frequency spectrum. In practice, Gaussian pulses with sufficiently narrow frequency spectrum and high amplitude are difficult to produce, and therefore other forms of selective pulses may be employed. In particular, both the said first and second pulse or pulses may comprise a sequence of pulses of the same or different intensity. For example, P.J. Hore in "A New Method for Water Suppression in the Proton NMR Spectra of Aqueous Solutions", Journal of Magnetic Resonance 54 pp. 539 to 542 (1983) describes the use of a sequence of four pulses, each of the same amplitude, but having relative durations respectively of 1, 3, 3 and 1 where the second and fourth pulses have a phase opposite the first and third pulses. The effect of such a sequence of pulses is effectively that of a single pulse with a broad frequency range, but having a "notch" or a broad null in the frequency spectrum, at which the amplitude is effectively zero. By appropriate choice of the pulse sequence, the "notch" can be made to coincide with the resonant frequency of water, to thereby effectively eliminate the excitation of the water resonance.

Alternatively, the first and second pulse may each be a so-called "DANTE" sequence, as described by G.A. Morris and R. Freeman in "Selective Excitation in Fourier Transform Nuclear Magnetic Resonance", Journal of Magnetic Resonance, 29, pp. 433–462 (1978). In a DANTE sequence, a large number of RF pulses are applied at equally spaced intervals, and the net effect is that of a plurality of RF "spikes", one of these "spikes" to coincide with the region of interest in the spectrum, selective excitation can be caused.

Whichever form of first and second selective pulses is chosen, the second pulse is such as to cause refocusing of the spin perturbed by the first pulse, to cause the formation of a spin echo. In this way, a first NMR signal is obtained which is a free induction decay signal that contains chemical shift information about a particular set of nuclei in a particular chemical environment.

A second NMR signal is then obtained by carrying out the same sequence, and applying during the experiment a third selective RF pulse, to cause inversion of the signal obtained in a narrow region of the NMR spectrum in which the substance of interest has a characteristic resonance. The third RF pulse may also be a "Gaussian", "1331" or "DANTE" sequence, but must have a selectivity which is sufficient to effect only the characteristic resonance which is of interest. It is particularly preferred to utilize a DANTE sequence. The third selective pulse or pulse sequence induces J-modulation in the substance of interest every time it is applied. For certain editing applications, the third selective pulse may be used to inhibit J-modulation. In practice, the third pulse or pulse sequence will generally be applied on every alternate signal acquisition, so that the signal inversion of the region of interest is observed on alternate scans. Alternate scans are then differenced, to obtain a third NMR signal, which is due essentially only to the characteristic resonance of the substance of interest. This gives an unambiguous indication that the substance is present in the sample.

In order to obtain information regarding the three-dimensional distribution of the substance in the sample, a conventional imaging teachnique may be applied. For example, in a modification of the technique described by Edelstein et al in U.S. Pat. No. 4,431,968, a set of pulsed magnetic field gradients are applied to the sample during one or both echo evolution periods when no RF pulse is being applied. These magnetic field gradients are applied along the X, Y and Z axis. Therefore, when the third selective pulse is applied, the signal for each field gradient contains a signal component whose J-modulation character differs from that obtained when the third pulse is not applied.

The functional form of each gradient is known. When the field gradients are incremented and the pulse sequences are repeated, a three-dimensional or four-dimensional Fourier transform is then performed to obtain the image of the substance in the sample.

DETAILED DESCRIPTION OF THE PREFERRED EMBODIMENT

The following discussion will concentrate on the use of $^1$H NMR to detect and map the presence of the metabolite lactate in a tissue sample which includes water and lipid components. $^1$H NMR is particularly useful in NMR experiments due to the natural abundance, strong magnetic moment and favorable signal to noise ratio (S/N) of $^1$H. Lactate is apt as a metabolite of interest because increased levels of lactate in a tissue sample can indicate hypoxic stress. Increased lactate levels may, therefore, be useful in medical diagnosis and experimentation. However, one having ordinary skill in the art will recognize that the methods of the present invention may be applicable to other forms of NMR such as $^{13}$C, $^{19}$F, and $^{31}$P, and to other substances which may be of interest to the experimentor or diagnostician.

The first step in producing a high resolution, spatially resolved $^1$H NMR image of lactate in a tissue sample is to suppress the signals resulting from the excitation of protons in the water components of the sample. This can be done by applying a frequency selective RF pulse sequence to the sample. This pulse sequence excites the sample in such a way that the observed frequency spectrum will contain a null at the water frequency but not at the frequency of lactate.

Those having skill in the art will recognize that the term "selective pulse" is a pulse which has a frequency bandwidth sufficient to accomplish the above-described effects and, therefore, is meant to encompass those pulses which may be described as "semi-selective".

In this application, the inventors prefer to use the $1\bar{3}3\bar{1}$ pulse sequence, a series of pulse sequences based on a binomial expansion or the sum of two or more binomial expansions, as described by P.J. Hore in "A New Method for Water Suppression in the Proton NMR Spectra of Aqueous Solutions", Journal of Magnetic Resonance, 54, pp. 539–542 (1983) incorporated into a standard Hahn spin echo experiment (e.g., [1-t$_1$-$\bar{3}$-t$_1$-3-t$_1$-$\bar{1}$]-t$_2$-[2-t$_1$-$\bar{6}$-t$_1$-6-t$_1$-$\bar{2}$]-t$_2$-ACQUIRE SIGNAL). The numbers represent the relative duration of the individual pulses while the bars indicate a pulse which is applied with the opposite phase from the non-bar pulses. t$_1$ is the interpulse delay time and t$_2$ is the spin-echo evolution time. t$_2$ is usually set to equal $\frac{1}{2}$J where J is the coupling constant.

The $1\bar{3}3\bar{1}$ Hahn spin echo sequence, provides impressive water suppression by creating a final spectral pulse power distribution approximating a $\mathrm{Sin}^3$F function, where F = $\pi$ft$_1$, and f is the offset in Hz from the carrier frequency. Resonances satisfying the condition f = $\frac{1}{2}$t$_1$ will receive the greatest excitation pulse, while nuclei resonating far from this optimal spectral region will experience a strongly attenuated RF pulse. In addition, the $\mathrm{Sin}^3$F dependence of the $2\bar{6}6\bar{2}$ 180° or $\pi$ pulse can affect the J-modulation of homonuclear J-coupled spin systems where J is the magnetic momentum of the spinning nuclei. The effect of a non-selective Hahn spin echo, $$(\pi/2)_x t_2 - (\pi)_x t_2 - AQ$$

on a set of J-coupled spins A, in an AX spin system is well documented. To summarize, the 90° or $\pi/2$ pulse tips the A magnetization onto the $-Y$ axis. During the first evolution period t$_2$ the A magnetization, when viewed in a frame rotating at the frequency of A, splits into two components which process at $+J/2$ and $-J/2$. If t$_2$ is set to $\frac{1}{2}$J, then at the end of this first evolution period one component of the A magnetization will be along $+X$ and the other along $-X$. The 180° or $\pi_x$ pulse has the effect of interchanging the X$\alpha$ for X$\beta$ spins. As a result, the two components of A magnetization reverse their directions of precession and refocus along $-Y$ at the end of the second t$_2$ period. Note that if the $(\pi)_x$ pulse had not inverted the X spin state, then the A magnetization would have refocused along $+Y$, in phase with any non-coupled spins. Thus, for a spin A, in an AX spin system to undergo full J-modulation during a spin echo experiment, its J-coupled spin, X, must have its spin state inverted during the "$\pi$" pulse. If the X spin receives a pulse other than a 180° pulse, the A spin will experience only partial J-modulation. In the absence of any pulse to the X spin, the A spin will not experience J-modulation. Therefore, incorporating a $1\bar{3}3\bar{1}$ sequence into a Hahn spin echo experiment will suppress water signals while allowing the detection of NMR signals from the lactate in the sample.

While the $1\bar{3}3\bar{1}$ sequence is preferred, other selective pulse sequences may be used. For example, a DANTE sequence, as described by G.A. Morris and R. Freeman in "Selective Excitation in Fourier Transform Nuclear Magnetic Resonance", Journal of Magnetic Resonance, 29, pp. 433–462 (1978) may be used. A DANTE sequence uses a number of short pulses separated by a small time delay period to excite the lactate protons. A modification to improve the selectivity of the DANTE includes shaping the envelope of the pulse sequence.

The next step is to edit the resultant signal spectrum to unambiguously indicate the presence of lactate in the sample. This is done by the application of a DANTE pulse sequence during the echo evolution of the first pulse sequence, only on every second repetition of the first pulse sequence. The DANTE acts to selectively induce (or inhibit) J-modulation in the lactate protons. By applying the DANTE on every second repetition of the first pulse sequence, two different NMR signals are obtained. One signal will have a component representing the presence (or absence) of J-modulation in the lactate protons, the other signal will not. By differencing these signals, an unambiguous indication of the presence of lactate in the sample can be obtained. The DANTE pulse sequence may be shaped in such a way as to enhance the frequency selectivity of the DANTE.

The first, second and third pulses or pulse sequences may be generated by the same RF transmitter or different RF transmitters, and may be applied to the sample using the same antenna or different antennae.

Figure 1:
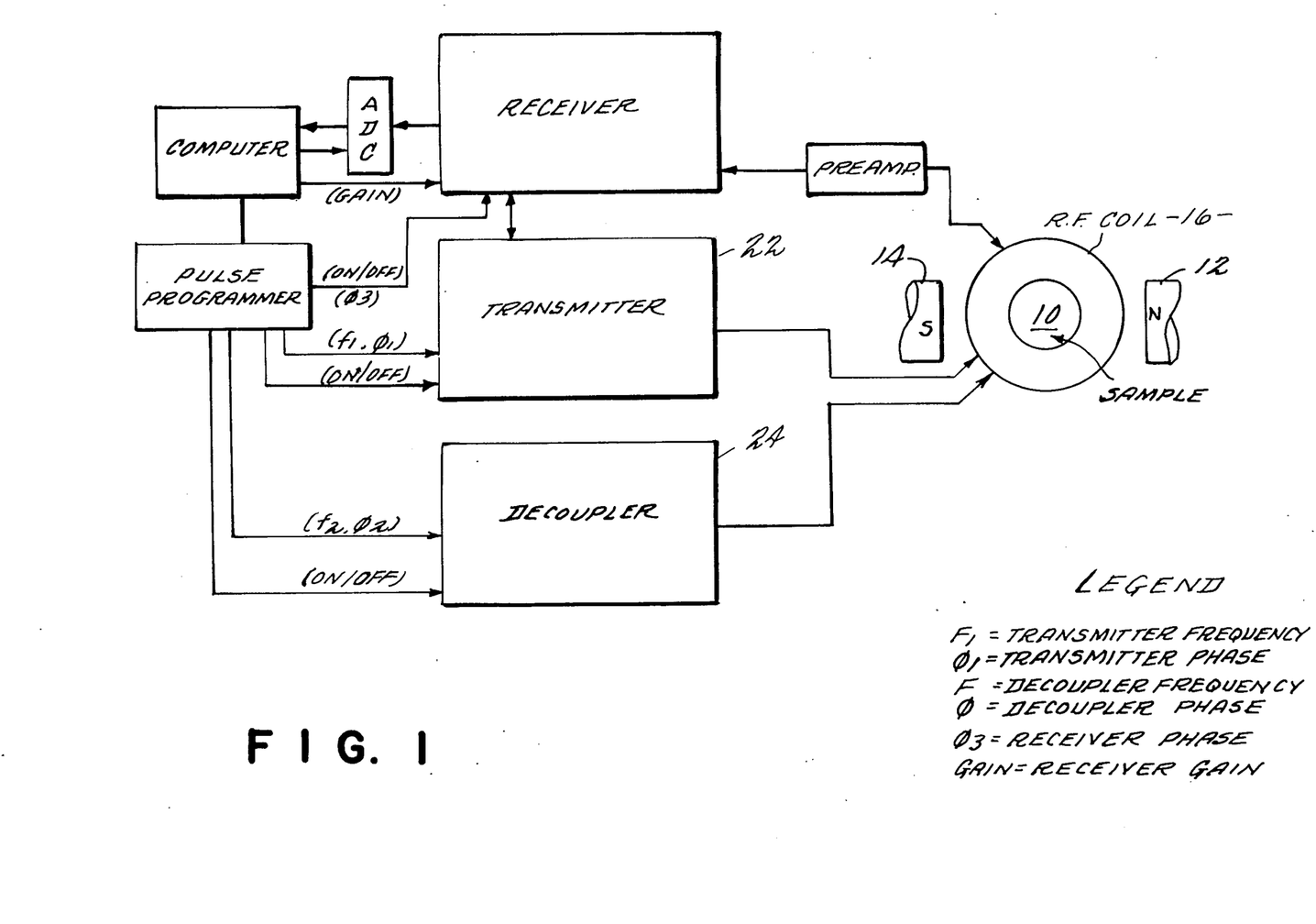
FIG. 1 is a block diagram of the equipment set-up for performing the experiment of unambiguously determining the presence of the substance of interest in the sample.

FIG. 1 is a block diagram of the equipment set-up for performing the above steps. The tissue sample 10 is placed in a static magnetic field represented by pole pieces 12 and 14. RF coil(s) 16 surrounds the sample and acts as a transmitting antenna for the various RF pulse sequences and as a receiving antenna to acquire the NMR signal. RF coil(s) 16 may be a single coil or a number of coils. Computer 18 acts to control all elements of the system and can be programmed to provide a wide variety of pulse sequences. Computer 18 thus is programmed with software which configures the system in a time dependent manner to perform the experiment described below. Computer 18 signals Pulse Programmer 20 to begin the experiment. Pulse Programmer 20 acts as a sequence controller to coordinate the on/off states of Transmitter 22, Decoupler 24 and Receiver 26. Transmitter 22 is commanded to generate a $1\bar{3}3\bar{1}$ pulse sequence followed by a $2\bar{6}6\bar{2}$ pulse sequence. This pulse sequence is applied to the RF coil(s) 16 and the nuclear spins within sample 10 are excited. At the end of the second pulse sequence, Pulse Programmer 20, turns off Transmitter 22 and turns on Receiver 26 to receive the resultant NMR signal. The gain of the Receiver 26 is controlled by Computer 18. The Receiver 26 sends the NMR signal to Analog to Digital Converter 28 which sends the digitized signal to Computer 18. The digitized signal can then be outputted to a recording or display device (not shown).

The process outlined above is then repeated except that during the second pulse sequence, the Pulse Programmer 20 commands Decoupler 24 to generate a DANTE sequence and send it to RF Coil(s) 16. Therefore, the NMR signal received during this sequence will contain a component representing the presence of J-modulation of the lactate protons.

Figure 2:
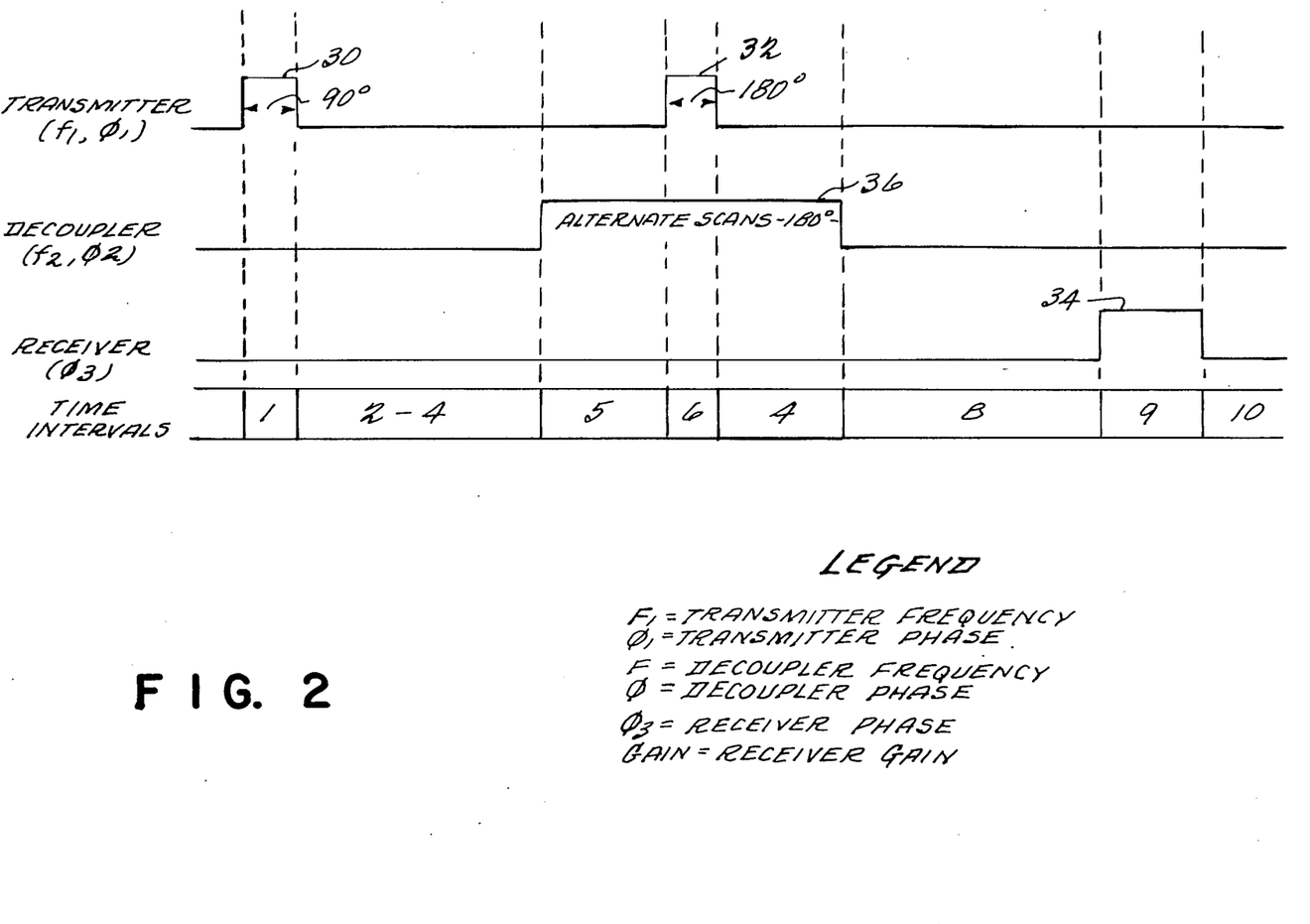
FIG. 2 is a timing sequence diagram of the experiment of FIG. 1.

FIG. 2 shows the timing sequence of this process. The first pulse sequence of the form $1\bar{3}3\bar{1}$ (90°) 30 is applied during time interval 1 to the A spins. During time interval 2–5 ($t_2$ -the first echo evolution period) the A spins will evolve under the influence of the X spins to which they are coupled. The $2\bar{6}6\bar{2}0$ second pulse sequence of the form (180°) 32 is then applied to the A spins during time interval 6. This tends to refocus the A magnetization at the end interval 8. During time interval 7–8 ($t_2$ -the second echo evolution period) the A spins will evolve under the influence of the X spins. During time interval 9, the receiver will acquire the NMR signal 34. During alternate scans, the decoupler will apply one or more DANTE sequence to the X spins. The DANTE can be applied any time during time intervals 2–8. In practice, the inventors have found it best to apply half the DANTE pulses during time interval 5 and the other half during time interval 7.

Figure 3:
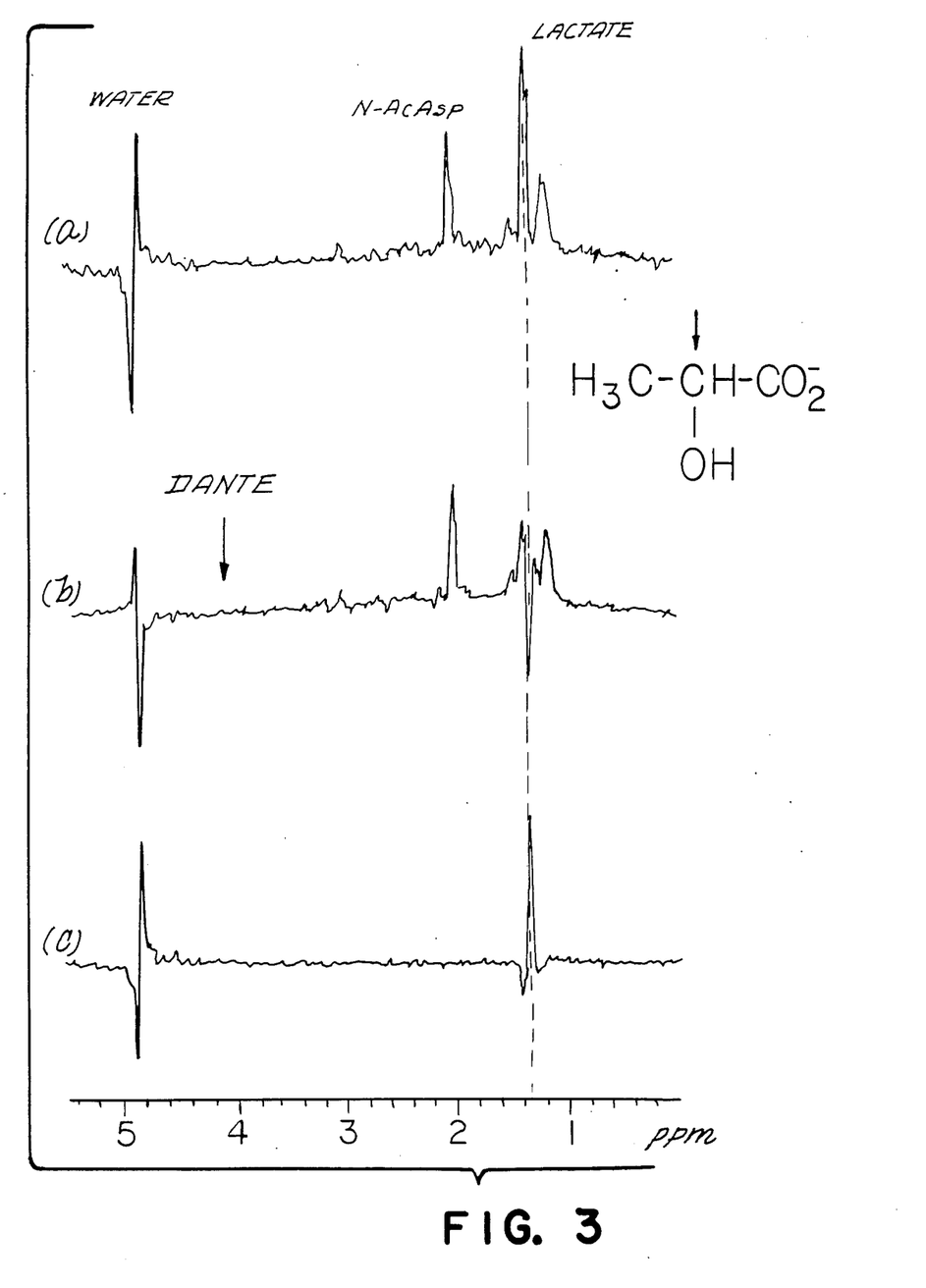
FIG. 3 is a series of NMR spectra resulting from the experiment of FIG. 1.

FIG. 3 shows the NMR signals acquired in the process outlined above. The X-axis is scaled in parts per million (ppm) which is a convenient expression of the chemical shift in terms of the total applied magnetic field. Spectrum 3a shows the non-J-modulated lactate spectrum, (DANTE INEFFECTIVE). Spectrum 3b shows the J-modulated lactate spectrum, (DANTE EFFECTIVE). Spectrum 3c is the differenced lactate spectrum which clearly indicates the presence of lactate in the sample.

Figure 4:
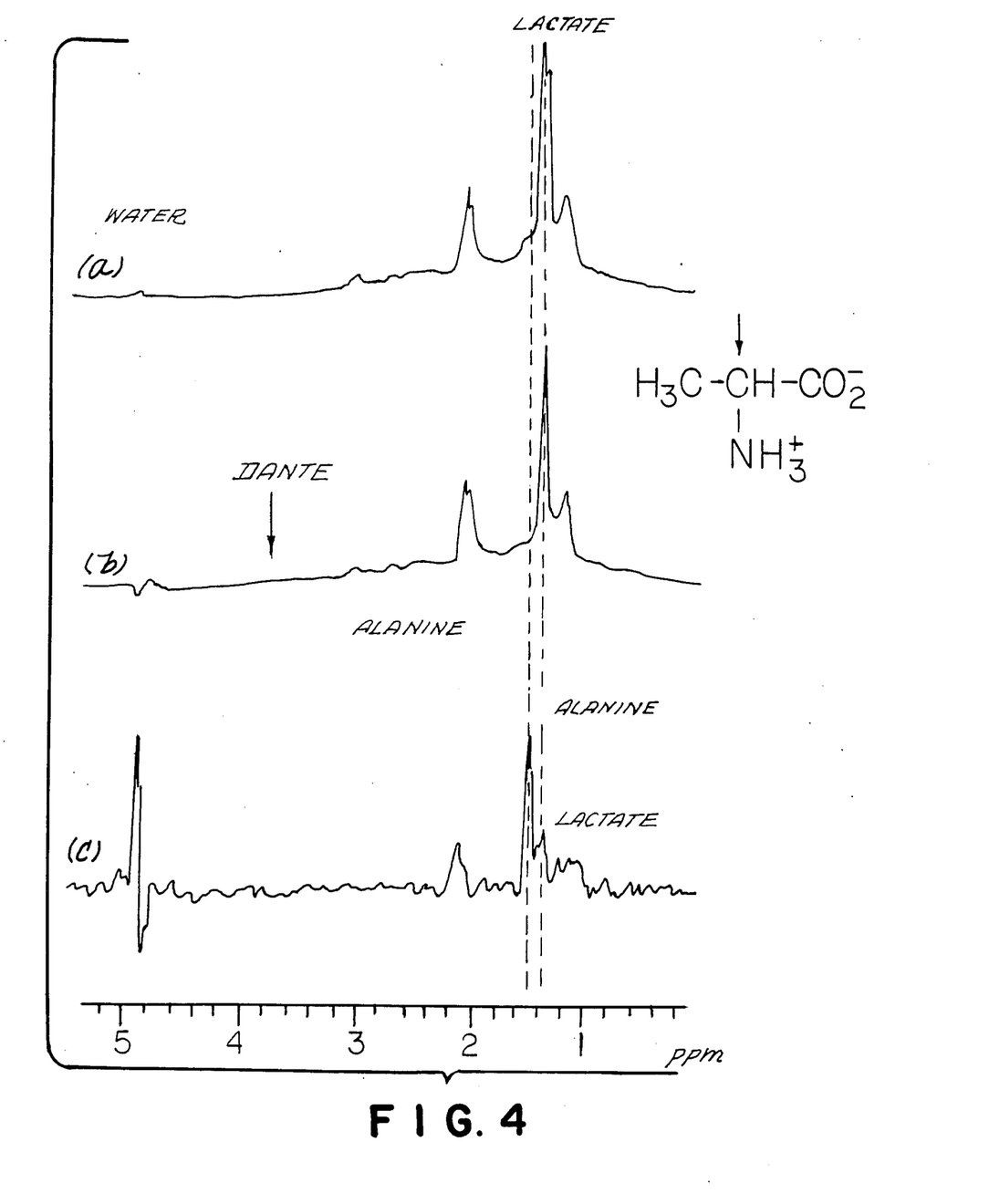
FIG. 4 is another series of NMR spectra also resulting from the experiment of FIG. 1.

The advantages of the present invention can be seen more clearly with reference to FIG. 4. In this case, the experimentors desired to determine the presence of alanine in the sample. Spectrum 4a shows that the alanine is made nearly indistinguishable by the overlapping lactate signal. When the DANTE is turned on, a trough appears at the alanine frequency, as seen in Spectrum 4b. This trough is also overlapped by the lactate signal. However, when the signals are differenced, the presence of alanine is clearly distinguishable as shown in Spectrum 4c.

Having thus unambiguously determined the presence of the metabolite of interest in the sample, the next step is to map the location of the metabolite in the tissue sample. This is done by applying a series of pulsed magnetic field gradients to the sample during the first echo evolution period ($t_2$) of the first pulse sequence when no RF pulses are being applied. The magnetic fields Gx, Gy, Gz are applied along the X, Y, Z axis of the sample, respectively. The three field gradients may be applied simultaneously or sequentially. Each of the field gradients will affect the static magnetic field so that the resultant field has a known configuration with magnetic strength different at each location in the field. The differing magnetic strengths cause the lactate protons to precess faster or slower depending where they are in the sample. After a given period of time, the many lactate protons will have precessed to different angles which are functions of the magnetic field at various locations in the sample. The phase differences of these protons are distinguishable and information about the spatial distribution of the lactate in the sample can be phase encoded. When the field gradient is turned off, the relative angles of the lactate protons are "frozen" in the sample and thus the phase shift is permanently encoded. The spatial distribution of the entire resonance of interest can then be determined by incrementing the magnetic field gradients and performing a three-dimensional Fourier transform on the data acquired. A spatially resolved high resolution $^1H$ NMR image can be obtained by performing a four dimensional Fourier transform on the acquired data.

It should be noted that one or more of the magnetic field gradients may be applied during the signal acquisition phase. If the field gradients are applied during signal acquisition, the frequency of resonance will contain both chemical shift and spatial distribution information. If the signal is then edited, only the peak of the lactate will remain. Thus, frequency information, as well as phase information, may be used to gain spatial distribution information about the lactate in the sample.

Figure 5:
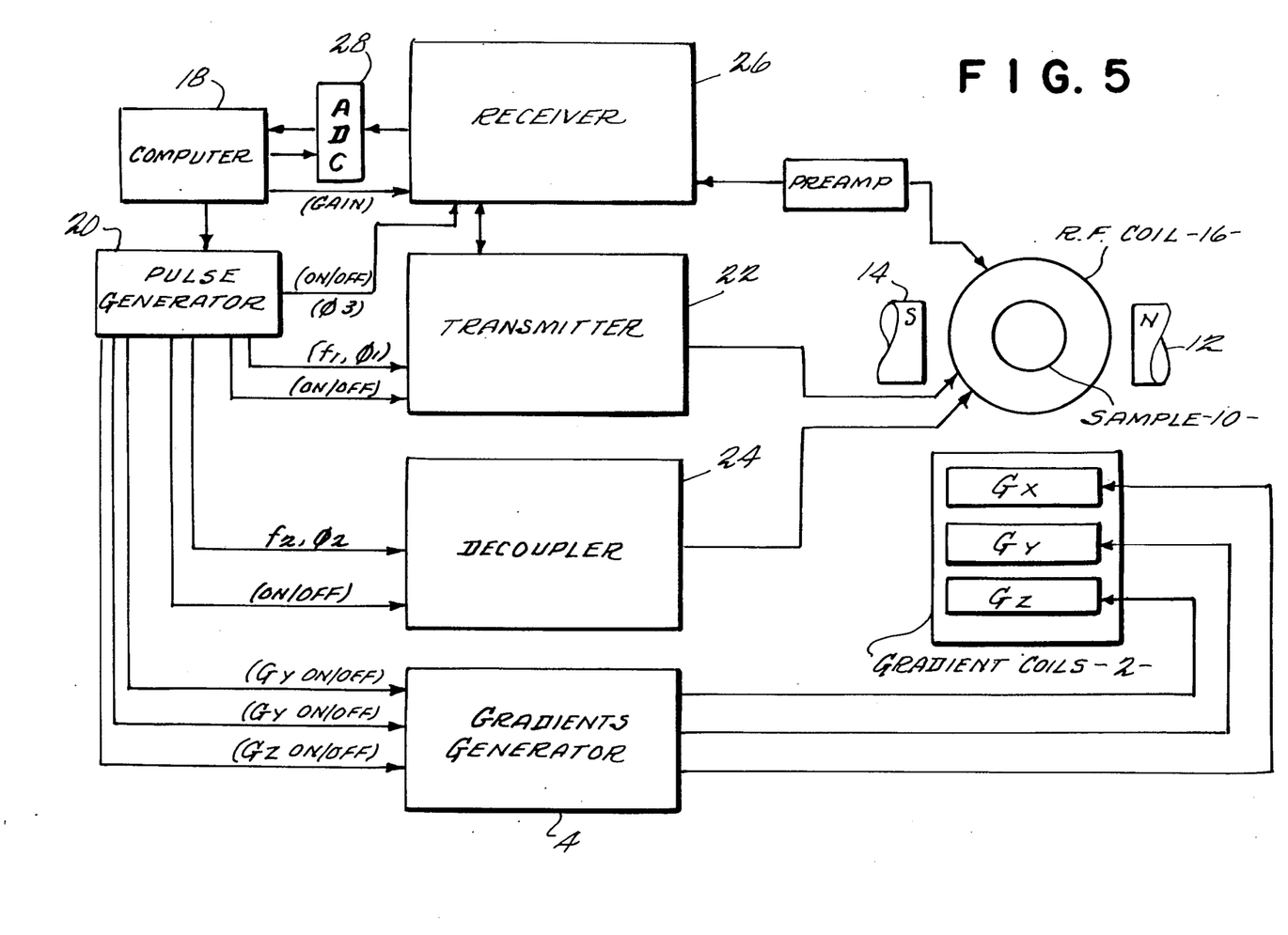
FIG. 5 is a block diagram of the equipment set-up for performing the full imaging experiment.

FIG. 5 is a block diagram of the equipment set-up for performing the above process. The equipment is the same as that shown in FIG. 1 except for the addition of Gradient Coils 2 and Gradient Unit 4. Gradient Coils 2 are disposed near the sample and provide the pulsed field gradients Gx, Gy, and Gz, as required. Gradient Unit 4 provides the Gradient Coils 2 with the appropriate electrical pulses, as commanded by the Pulse Programmer 20. Pulse programmer 20 must now coordinate the application of three pulse sequences generated by Transmitter 22, Decoupler 24 and Gradient Unit 4.

Figure 6:
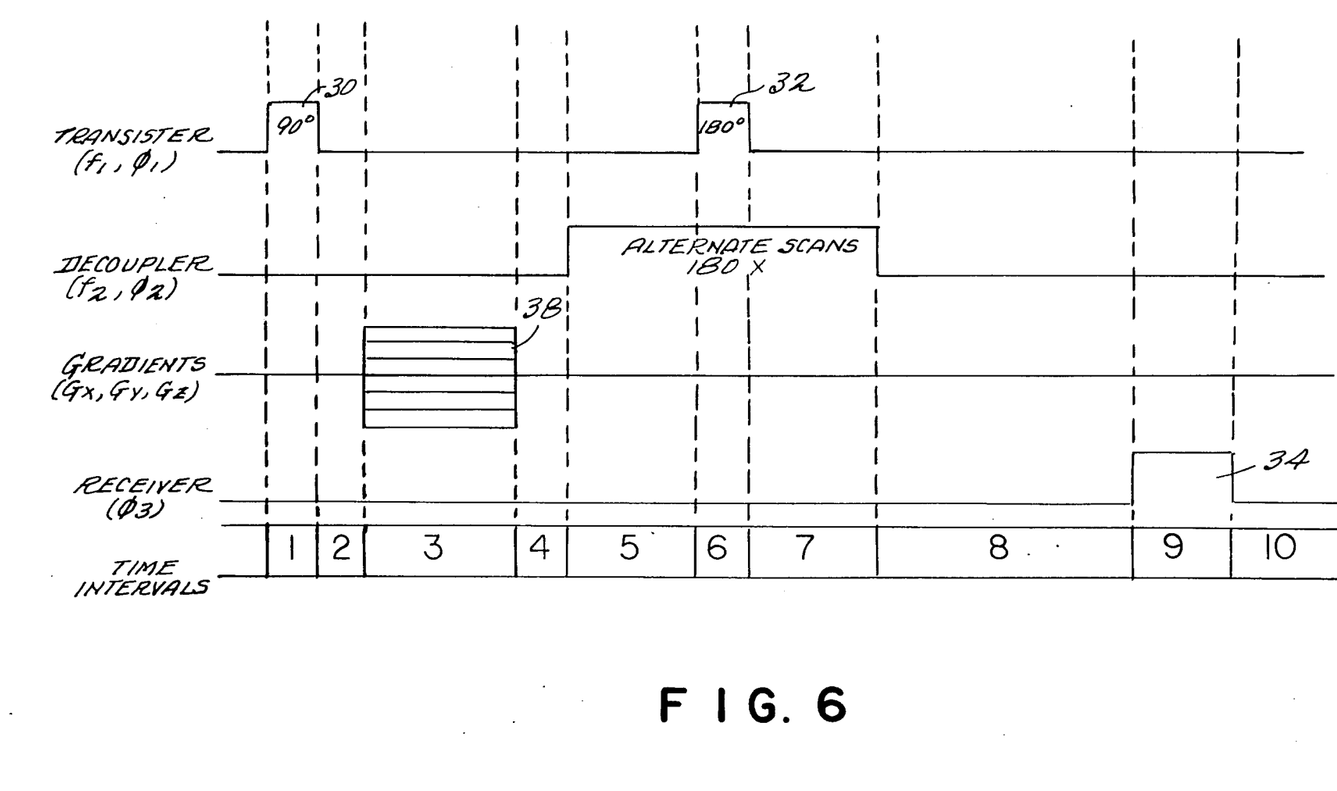
FIG. 6 is a timing sequence diagram of the imaging experiment.

FIG. 6 shows the timing sequence for the full imaging experiment. FIG. 6 is like FIG. 2 only the pulsed field gradients Gx, Gy, and Gz 38 have been added. During time interval 1, the 90° pulse 30 is applied to the A spins. In time interval 2–5, the A spins will evolve under the influence of the X spins. In this example, gradients 38 have been applied sometime during the echo evolution periods, either before or after the DANTE 36 is turned on. The inventors have found it advisable to provide time intervals 2 and 4 before and after the application of Gradients 38 so that no signal interference or overlap will disturb the application of the DANTE. Therefore, Gradients 38 are applied during time interval 3 to phase encode the spatial location of the spins excited by 90° pulse 30. The DANTE 36 is applied during time intervals 5–7 to invert the X spins. The 180° pulse 32 is applied during time interval 6 to the A spins to ensure that the A magnetization will be refocused at time interval 8. During time intervals 7–8, the A spins evolve under the influence of the X spins. This echo evolution period is then followed by the acquisition 34 of the NMR signal by the receiver. However, the method according to the present invention is operable no matter what order the second pulse sequence 32, the DANTE 36, and the gradients 38 are applied. Thus, these three steps may be applied in any order, with respect to each other, so long as the gradients 38 are applied when no RF pulse sequence is being applied.

By phase encoding the NMR signals before they are acquired by the receiver and differencing the received NMR signals prior to the Fourier transformation, a great deal of signal processing and computation time can be saved. However, spatial distribution information on the chemical shift of a substance in a sample can also be obtained by omitting the third RF pulse sequence. This process is performed as described above but omitting the step of applying the DANTE 36 to the sample. While not attaining all the advantages inherent in the method depicted in FIG. 6, this shortened process may have advantages in certain specific applications.

While this invention has been described with reference to particular embodiments and examples, those having ordinary skill in the art will recognize that various modifications can be made to this invention without departing from the teachings contained therein. Accordingly, it should be understood that within the scope of the following claims, the invention may be practiced other than as specifically described above.

What is claimed is:

1. A method for obtaining the spatial distribution of specific substances in a sample by NMR, comprising the steps of:
   (a) applying a static magnetic field to said sample;
   (b) repetitively applying a first frequency selective RF pulse sequence to said sample;
   (c) repetitively applying a second frequency selective RF pulse sequence to said sample to produce a spin echo;
   (d) selectively applying a third frequency selective RF pulse sequence to said sample;
   (e) applying pulsed magnetic field gradients to said sample during a time when no RF pulse sequences are being applied, for phase or frequency encoding spatial distribution information about said substance in said sample;
   (f) acquiring first NMR signals from said sample when said third pulse sequence is applied, and second NMR signals from said sample when said third pulse sequence is not applied; and
   (g) differencing said first and said second NMR signals and producing a differenced NMR signal;
   wherein steps (c), (d), and (e) may be applied in any order with respect to each other.

2. A method according to claim 1 including the further step of (h) performing a three dimensional Fourier transformation on said differenced NMR signal to obtain spatial distribution information about said sample.

3. A method according to claim 1 including the further step of (h') performing a four dimensional Fourier transformation on said differenced NMR signal to obtain spatial distribution information about said sample.

4. A method according to claim 2 including the further step of (i) producing a three dimensional, spatially resolved image of said sample from said spatial information.

5. A method according to claim 3 including the further step of (i) producing a three dimensional, spatially resolved image of said sample from said spatial information.

6. A method according to claim 1 wherein said first and said second and said third pulse sequences may each be an individual Gaussian pulse.

7. A method according to claim 1 wherein said first and said second pulse sequences are related to each other by a binomial series or the sum of two or more binomial series.

8. A method according to claim 1 wherein said third pulse sequence is applied during every second repetition of said first and said second pulse sequences.

9. A method according to claim 1 wherein said third pulse sequence is applied so as to be effective only during every second repetition of said first and said second pulse sequences.

10. A method according to claim 1 wherein said step (d) is performed during said step (c).

11. A method according to claim 1 wherein step (e) is performed a first predetermined period of time after said step (b) but a second predetermined period of time before said step (d).

12. A method according to claim 11 wherein said first pulse sequence is a $1\text{-}t_1\text{-}\bar{3}\text{-}t_1\text{-}3\text{-}t_1\text{-}\bar{1}$ sequence, wherein the numbers designate a pulse duration period, the bar designates a pulse phase reversed from the non-bar pulses and $t_1$ is a delay period.

13. A method according to claim 12 wherein said second pulse sequence is a $2\text{-}t_1\text{-}\bar{6}\text{-}t_1\text{-}6\text{-}t_1\text{-}\bar{2}$ sequence.

14. A method according to claim 11 wherein said third pulse sequence is a DANTE sequence.

15. A method according to claim 11 wherein said first and said second pulse sequences are both DANTE sequences.

16. A method according to claim 14 wherein step (e) includes the steps of (e1) applying a pulsed magnetic field gradient in the x-y plane, Gx, (e2) applying a pulsed magnetic field gradient in the y-z plane, Gy, (e3) applying a pulsed magnetic field gradient in the x-z plane, Gz.

17. A method of obtaining a three-dimensional NMR image of substances in a sample situated in a magnetic field comprsing the steps:
   (a) applying, for a first predetermined time interval, a first frequency selective RF pulse sequence to excite a plurality of nuclear spins in said sample, said first pulse sequence being applied in the absence of any magnetic field gradient;
   (b) waiting a firs echo evolution time period;
   (c) applying, during a second predetermined time interval subsequent to said first predetermined time interval at a time when no RF pulse sequneces are being applied:
      (1) a first magnetic field gradient directed along a first axis of said sample for phase encoding spatial distribution information about the nuclear spins of said substances along said first axis;
      (2) a second magnetic field gradient directed along a second axis of said sample, orthogonal to said first axis, for phase encoding spatial distribution information about the nuclear spins of said substances along said second axis,
  (3) a third magnetic field gradient directed along a third axis of said sample, orthogonal to said first and said second axes, for phase encoding spatial distribution information about the nuclear spins of said substances along said third axis;
(d) applying, for a third predetermined time interval subsequent to said first echo evolution period, a second frequency selective RF pulse sequence, said second pulse sequence being applied in the absence of any magnetic field gradient;
(e) waiting a second echo evolution time period;
(f) applying, during sid first and/or said second echo evolution periods, a third frequency selective RF pulse sequence;
(g) acquiring a spin echo signal at the end of said second echo evoltion period, said spin echo signal containing information from which said three-dimensional NMR image can be obtained.

18. A method according to claim 17 wherein step (g) includes acquiring said spin echo signal at any time following the application of said second pulse sequence.

19. A method according to claim 17 wherein steps (a)–(g) are repetitively performed except that step (f) is performed only in every second repetition.

20. A method according to claim 17 wherein steps (a)–(g) are repetitively performed except that step (f) is made effective only on every second repetition of said steps (a)–(g).

21. A method according to claim 19 including the further step of (h) differencing the spin echo signals received from steps (a)–(g) with the spin echo signals received from the steps (a)–(e), (g) and producing a differenced NMR signal.

22. A method according to claim 21 including the further step of (i) performing a three dimensional Fourier transformation on said differenced NMR signal to obtain spatial image information about said metabolite in said sample.

23. A method according to claim 21 including the further step of (i') performing a four dimensional Fourier transformation on said differenced NMR signal to obtain spatial image information about said metabolite in said sample.

24. A method according to claim 22 including the further step of (j) producing a three dimensional, spatially resolved image of said metabolite in said sample from said spatial information.

25. A method according to claim 23 including the further step of (j) producing a three dimensional, spatially resolved image of said metabolite in said sample from said spatial information.

26. A method according to claim 21 in which said first pulse sequence is a $1$-$t_1$-$\bar{3}$-$t_1$-$3$-$t_1$-$\bar{1}$ sequence, wherein the numbers designate relative pulse duration periods, the bars designate a phase opposite from the non-bar pulses, and $t_1$ designates a predetermined time delay period.

27. A method according to claim 26 in which said second pulse sequence is a $2$-$t_1$-$\bar{6}$-$t_1$-$6$-$t_1$-$\bar{2}$ sequence.

28. A method according to claim 27 in which said third pulse sequence is a DANTE sequence.

29. A method according to claim 28 wherein said DANTE pulse sequence is shaped in a way so as to enhance the frequency selectivity of said DANTE pulse sequence.

30. A method according to claim 21 wherein said first and said second pulse sequences are both DANTE sequences.

31. A method according to claim 30 wherein said both DANTE pulse sequences are shaped in a way so as to enhance the frequency selectivity of said both DANTE pulse sequences.

32. A method of determining the presence of low concentration substances in a sample by NMR comprising the steps of:
(a) applying a static magnitc field to said sample;
(b) repetitively applying a first frequency selective RF pulse or pulse sequence to said sample in the absence of any magnetic field gradient;
(c) repetitively applying a second frequency selective RF pulse or pulse sequence to said sample in the absence of any magnetic field gradient;
(d) selectively applying a third frequency selective RF pulse or pulse sequence to said sample; and
(e) acquiring a signal from said sample indicating the presence of said substances in said sample.

33. A method according to claim 32 wherein said first pulse or pulse sequence is a $1$-$t_1$-$\bar{3}$-$t_1$-$3$-$t_1$-$\bar{1}$ pulse sequence, wherein the numbers designate relative pulse duration periods, the bar designates a pulse applied with a phase as which is reverse to the other pulses, $t_1$ designates a predetermined time delay period.

34. A method according to claim 33 wherein said second pulse or pulse sequence is a $2t_1$-$\bar{6}$-$t_1$-$6$-$t_1$-$\bar{2}$ pulse sequence.

35. A method according to claim 34 wherein said third pulse or pulse sequence is a DANTE pulse sequence.

36. A method according to claim 32 wherein said first and said second pulse or pulse sequences are both DANTE pulse sequences.

37. A method for obtaining spatial distribution information of the chemical shift of a substance in a sample by NMR comprising the steps:
(a) applying a static magnetic field to said sample;
(b) applying a first frequency selective RF pulse or pulse sequence to said sample;
(c) applying a second frequency selective RF pulse or pulse sequence to said sample;
(d) applying pulsed magnetic field gradients to said sample, at a time when no RF pulse or pulse sequence is being applied, for phase or frequency encoding spatial distribution information about said substance in said sample; and
(e) repeating steps (b) and (c) above and applying to said substance in alternate repetitions of steps (b) and (c) a third RF pulse or pulse sequence;
(f) acquiring a first NMR signal from said substance when said third RF pulse or pulse sequence is applied and a second NMR signal from said substance when said third RF pulse or pulse sequence is not applied, and
(g) differencing said first and second NMR signals to provide a differenced signal which contains said spatial distribution information of said chemical shift of said substance.

38. A method of obtaining the spatial distribution of a substance in a sample, which method comprises
(a) subjecting the sample to a static homogeneous magnetic field;
(b) applying to the sample at least one first RF pulse to selectively excite nuclear spins in a region of the NMR spectrum in which the substance has a characteristic resonance, and at least one second selective RF pulse adapted to refocus spins perturbed by the first selective pulse, to produce a spin echo;

(c) observing the spin echo free induction decay of the nuclear magnetism of the sample;

(d) obtaining thereby a first NMR signal;

(e) repeating steps (b) and (c) above and applying to the sample at least one third RF pulse to selectively cause the inversion of the signal obtained in a narrow region of the NMR spectrum in which the substance has a characteristic resonance, to obtain a second NMR signal;

(f) differencing said first and said second NMR signals to obtain a third NMR signal due essentially only to the said characteristic resonance of the said substance; and (g) applying an imaging technique to said third NMR signal to produce a map of the distribution of said substance in said sample.

39. A method as claimed in claim 38, wherein the said at least one first pulse is a first pulse train, the intensity of the pulses in the train being related to each other by a binomial series or the sum of two or more binomial series where each pulse in the train is separated by a time delay.

40. A method as claimed in claim 39 in which alternate pulses in the series have a phase difference of 180°.

41. A method as claimed in claim 39, wherein the said at least one second pulse is a second pulse train, the intensity of the pulses in the train being related to each other by a binomial series or the sum of two or more binomial series.

42. A method as claimed in claim 41, wherein the pulses of said first pulse train have relative intensities of 1,3,3, and 1, and the pulses of said second pulse train have relative intensities of 2,6,6, and 2, alternate pulses of both of the said first and said second pulse trains having a phase difference of 180°.

43. A method according to claim 38 wherein the said at least one third pulse consists of a train of identical pulses separated by time delay $t_3$.

44. A method according to claim 38 wherein said at least one third pulse is applied on every alternate repetition of said steps (b) and (c) prior to observation of free induction decay.

45. A method according to claim 44 wherein said at least one third pulse is applied only during gaps in said first pulse sequence.

46. Apparatus for obtaining the spatial distribution of specific substances in a sample by NMR, comprising:
means for applying a static magnetic field to said sample;
means for repetitively applying a first frequency selective RF pulse or pulse sequence to said sample;
means for repetitively applying a second frequency selective RF pulse or pulse sequence to said sample to produce a spin echo;
means for selectively applying a third frequency selective RF pulse or pulse sequence to said sample;
means for applying pulsed magnetic field gradients to said sample during a time when no RF pulse or pulse sequences are being applied, for phase or frequency encoding spatial distribution information about said substance in said sample;
means for acquiring first NMR signals from said sample when said third pulse or pulse sequence is applied, and second NMR signals from said sample when said third pulse sequence is not applied; and
means for differencing said first and said second NMR signals and producing a differenced NMR signal.

47. Apparatus according to claim 46 including means for performing a three dimensional Fourier transformation on said differenced NMR signal to obtain spatial distribution information about said sample.

48. Apparatus according to claim 46 including means for performing a four dimensional Fourier transformation on said differeneced NMR signal to obtain spatial distribution information about said sample.

49. Apparatus for obtaining a three-dimensional NMR image of substances in a sample situated in a magnetic field comprsing:
means for applying, for a first predetermined time interval, a first frequency selective RF pulse sequency to excite a plurality of nuclear spins in said sample, and waiting a first echo evolution time period, said first pulse sequence being applied in the absence of any magnetic field gradient;
means for applying, during a second predtermined time interval subsequent to said first predetermined time interval at a time when no RF pulse sequences are being applied:
(1) a first magnetic field gradient directed along a first axis of said sample for phase encoding spatial distribution information about the nuclear spins of said substances along said first axis;
(2) a second magnetic field gradient directed along a second axis of said sample, orthogonal to said first axis, for phase encoding spatial distribution information about the nuclear spins of said substances along said second axis,
(3) a third magnetic field gradient directed along a third axis of said sample, orthogonal to said first and second axes, for phase encoding spatial distribution information about the nuclear spins of said substances along said third axis;
means for applying, for a third predetermined time interval subsequent to said first echo evolution period, a second frequency selective RF pulse sequence, and waiting a second echo evolution time period, said second pulse sequence being applied in the absence of any magnetic field gradient;
means for applying, during said first and/or second echo evolution periods, a third frequency selective RF pulse sequence; and
means for acquiring a spin echo signal at the end of said second echo evolution period, said spin echo signal containing information from which said three-dimensional NMR image can be obtained.

50. Apparatus for determining the presence of low concentration substances in a sample by NMR comprising:
means for applying a static magnetic field to said sample;
means for repetitively applying a first frequency selective RF pulse sequence to said sample in the absence of any magnetic field gradient;
means for repetitively applying a second frequency selective RF pulse sequence to said sample in the absence of any magnetic field grandient;
means for selectively applying a third frequency selective RF pulse sequence to said sample; and
means for acquiring a signal from said sample indicating the presence of said substances in said sample.

51. Apparatus for obtaining spatial distrubution information of the chemical shift of a substance in a sample by NMR comprising:
- means for applying a static magnetic filed to said sample;
- means for repetitvely applying a first frequency selective RF pulse to said sample;
- means for repetitively applying a second frequency selective RF pulse to said sample;
- means for applying pulsed magnetic field gradients to said sample, at a time when no RF pulse is being applied, for phase encoding spatial distribution information about said substance in said sample;
- means for applying a third RF pulse to said sample only during every other repetition of said first and second RF pulses;
- means for acquiring a first NMR signal form said sample when said third RF pulse is applied, and a second NMR signal from said sample when said third RF pulse is not applied; and
- means for differencing said first and second NMR signals to provide a difference signal which contains said spatial distribution information of said chemical shift of said substance.

52. Apparatus for obtaining an NMR spectrum which apparatus comprises:
- means for producing a homogeneous magnetic field in a sample region;
- means for repetitively applying to the sample region at least one first selective RF pulse, said first pulse being such as to selectively excite nuclear spins in the NMR spectrum in the region of a desired resonance, and at least one second radio frequency pulse, said second pulse being a selective pulse adapted to refocus said spins in the sample region to produce a spin echo;
- menas for observing a free induction decay of said nuclear spins in said sample region, and for producing from said spin echo a first NMR signal;
- means for selectively applying to said sample region at least one third RF pulse, the third pulse being such as to cause inversion of the NMR spectrum in said region of the desired resonance, whereby a second NMR signal may be obtained at a conclusion of the apllication of said third RF pulse;
- means for causing the third radio frequency selective RF pulse to be applied selectively to permit the obtaining of a spin echo signal both with said without being affected by said third RF pulse;
- means for differencing said first and said second NMR signals to obtain a third NMR signal due essentially only to a characteristic resonance of a single substnace in the sample region; and
- means for carrying out an imaging technique on the third NMR signal to determine the spatial distribution of the said single substance in said sample region.

53. Apparatus as claimed in claim 52, wherein said means for applying said at least one first selective RF pulse produces a train of pulses of relative duration 1,3,3, and 1, adjacent pulses being 180° out of phase.

54. Apparatus as claimed in claim 52, wherein said means for generating said at least one third RF pulse comprises means for generating a DANTE pulse sequence.

55. Apparatus as claimed in claim 52, wherein said means for carrying out an imaging technique includes means for applying to the sample region pulsed magnetic field gradients during a time when no RF pulses are being applied, for phase or frequency encoding in nuclei in the sample region information about spatial distribution.

56. Apparatus as claimed in claim 52, further including means for performing a four dimensional Fourier transformation on said third NMR signal to obtain spatial information about a substance in the sample region.

* * * * *

UNITED STATES PATENT AND TRADEMARK OFFICE
CERTIFICATE OF CORRECTION

PATENT NO. : 4,678,995
DATED : July 7, 1987
INVENTOR(S) : Malcolm J. Avison, et al It is certified that error appears in the above-identified patent and that said Letters Patent is hereby corrected as shown below:

Column 1, line 12, isert the following:

The invention identified above is a subject invention under 35 U.S.C. 200, et seq., and the Standard Patent Rights Clause at 37 C.F.R. 401.14 or F.A.R. 52.227-11, which are included among the terms of the above-identified grant/contract award from the Public Health Service/National Institutes of Health.

Signed and Sealed this

Thirteenth Day of April, 1999

*Attest:*

Q. TODD DICKINSON

*Attesting Officer*     *Acting Commissioner of Patents and Trademarks*